United States Patent
Liu et al.

(10) Patent No.: US 10,400,167 B2
(45) Date of Patent: Sep. 3, 2019

(54) ETCHING COMPOSITIONS AND METHODS FOR USING SAME

(71) Applicant: Versum Materials US, LLC, Tempe, AZ (US)

(72) Inventors: Wen Dar Liu, Chupei (TW); Yi-Chia Lee, Chupei (TW); Tianniu Chen, Westford, MA (US); Thomas Mebrahtu, Lansdale, PA (US); Aiping Wu, Macungie, PA (US); Edward Chia Kai Tseng, St. Taoyuan (TW); Gene Everad Parris, Coopersburg, PA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/357,527

(22) Filed: Nov. 21, 2016

(65) Prior Publication Data

US 2017/0145311 A1    May 25, 2017

Related U.S. Application Data

(60) Provisional application No. 62/300,382, filed on Feb. 26, 2016, provisional application No. 62/259,870, filed on Nov. 25, 2015.

(51) Int. Cl.
*C09K 13/00* (2006.01)
*H01L 21/306* (2006.01)
*H01L 29/06* (2006.01)

(52) U.S. Cl.
CPC ........ *C09K 13/00* (2013.01); *H01L 21/30604* (2013.01); *H01L 21/30608* (2013.01); *H01L 29/0684* (2013.01)

(58) Field of Classification Search
None
See application file for complete search history.

(56) References Cited

U.S. PATENT DOCUMENTS 5,567,574 A    10/1996 Hasemi et al.
7,851,313 B1    12/2010 Luo et al.
(Continued)

FOREIGN PATENT DOCUMENTS

| EP | 1616438 A2 | 2/2006 |
|---|---|---|
| JP | 2000164597 A2 | 6/2000 |
| JP | 2006186329 A2 | 7/2006 |

OTHER PUBLICATIONS

Kim, Dennis, et al., "Silicon Wet Isotropic and Anisotropoic Etching", ENEE 416, pp. 1-4.
(Continued)

*Primary Examiner* — Roberts P Culbert
(74) *Attorney, Agent, or Firm* — Anne B. Kiernan

(57) ABSTRACT

A composition and method using same useful for etching a semiconductor substrate comprising: from about 25 to 86% by weight of water; from about 0 to about 60% by weight of a water-miscible organic solvent; from about 1 to about 30% by weight of a base comprising a quarternary ammonium compound; from about 1 to about 50% by weight of an amine compound wherein the amine compound is selected from the group consisting of a secondary amine, a tertiary amine, and mixtures thereof; from about 0 to about 5% by weight of a buffering agent; from about 0 to about 15% by weight of a corrosion inhibitor.

22 Claims, 3 Drawing Sheets

Sigma etching profile

(56) References Cited

U.S. PATENT DOCUMENTS

Figure 1A:
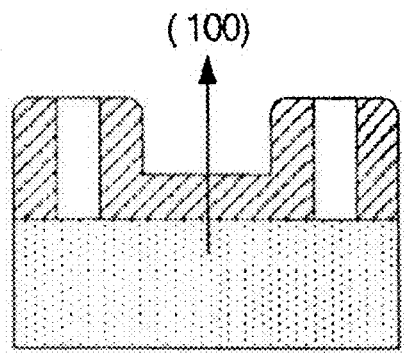

| | | |
|---|---|---|
| 8,846,533 B2 | 9/2014 | Ishibashi |
| 2004/0259761 A1 | 12/2004 | Yokoi et al. |
| 2006/0166847 A1* | 7/2006 | Walker .................. C11D 7/261 510/175 |
| 2009/0082240 A1 | 3/2009 | Nukui et al. |
| 2009/0218542 A1 | 9/2009 | Isami et al. |
| 2010/0248495 A1 | 9/2010 | Yaguchi et al. |
| 2013/0015443 A1 | 1/2013 | He et al. |
| 2014/0109931 A1 | 4/2014 | Lee et al. |

OTHER PUBLICATIONS

Colin, "Anisotropic wet etching of silicon with alkaline etchants", MEMS Library, pp. 1-8.
Etching (microfabrication); Wikipedia, https://en.wikipedia.org/wiki/Etching_(microfabrication), pp. 1-10.

* cited by examiner

Sigma etching profile

Convention

V shape

Target

Flat bottom

ETCHING COMPOSITIONS AND METHODS FOR USING SAME

CROSS-REFERENCE TO RELATED APPLICATIONS

This application claims priority to provisional application Ser. No. 62/300,382 filed Feb. 26, 2016 and provisional application Ser. No. 62/259,870 filed Nov. 25, 2015, both of which are incorporated herein by reference in their entities.

BACKGROUND

The present invention provides compositions that can be used for a variety of applications including, for example, removing unwanted resist films, post-etch, silicon etching, and post-ash residue on a semiconductor substrate. In particular, the present invention provides etching compositions that are particularly useful for anisotropic and isotropic silicon etch.

The background of the present invention will be described in connection with its use in etching applications involving the manufacture of integrated circuits. It should be understood, however, that the use of the present invention has wider applicability as described hereinafter.

In the manufacture of integrated circuits, it is sometimes necessary to etch openings or other geometries in a thin film deposited or grown on the surface of silicon, gallium arsenide, glass, or other substrate located on an in-process integrated circuit wafer. Present methods for etching such a film require that the film be exposed to a chemical etching agent to remove portions of the film. The particular etching agent used to remove the portions of the film depends upon the nature of the film. In the case of an oxide film, for example, the etching agent may be hydrofluoric acid. In the case of a polysilicon film, it will typically be hydrofluoric acid or a mixture of nitric acid and acetic acid.

In order to assure that only desired portions of the film are removed, a photolithography process is used, through which a pattern in a computer drafted photo mask is transferred to the surface of the film. The mask serves to identify the areas of the film which are to be selectively removed. This pattern is formed with a photoresist material, which is a light sensitive material spun onto the in-process integrated circuit wafer in a thin film and exposed to high intensity radiation projected through the photo mask. The exposed or unexposed photoresist material, depending on its composition, is typically dissolved with developers, leaving a pattern which allows etching to take place in the selected areas, while preventing etching in other areas. Positive-type resists, for example, have been extensively used as masking materials to delineate patterns on a substrate that, when etching occurs, will become vias, trenches, contact holes, etc.

Wet etching is a process in which chemical compositions are used to dissolve the areas of a silicon substrate that are not protected by a mask. There are two different types of etching: isotropic etching and anisotropic etching. Isotropic etching is considered non-directional etching meaning that it erodes the substrate equally in all directions. A key disadvantage of isotropic etching is that it may cause undercutting or etching under the mask itself. Another disadvantage of isotropic etching is the chemicals used in the process. Typical isotropic etchant chemicals may include hydrofluoric acid which presents problems in handling, safety and disposal. Lastly, isotropic etching is prone to high defect levels due to particulate contamination and has poor process control.

Anisotropic etching, unlike isotropic etching, provides a directional etching of the substrate surface. In this regard, undercutting under the mask is sharpened to well-defined corners because the typical etchant chemicals used in this process such as potassium hydroxide (KOH), tetramethylammonium hydroxide (TMAH), and tetraethylammonium hydroxide (TEAH), which etch at different rates for different crystal orientations such as Si(110), Si (100), and Si (111) crystal plans. Very specific etch patterns can be implemented due to the use of directional dependent etchants. For example, conventional TMAH-based etchant chemicals typically provide a "V shaped" profile. Etch rates can be further controlled by etchant type, concentration and temperature. Like isotropic etching, there are also drawbacks to anisotropic etching. The anisotropic etching process is orientation dependent which can cause issues. In this regard, silicon wafers should be chosen with a certain Miller index orientation to control the etch pattern in the wafer. Like isotropic etching, the etchant chemicals also present problems in handling, safety, and disposal.

Figure 1B:
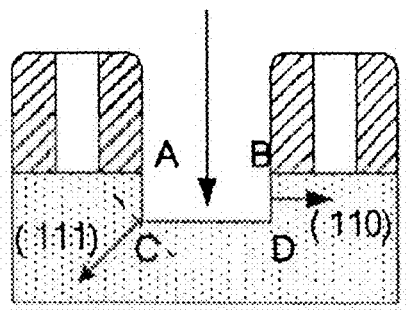
Figure 1C:
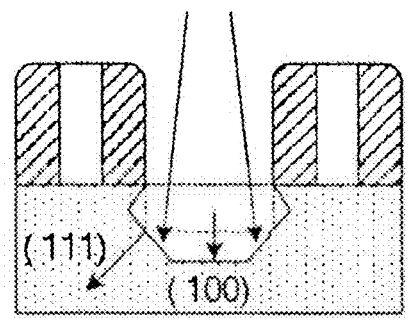
Figure 2:
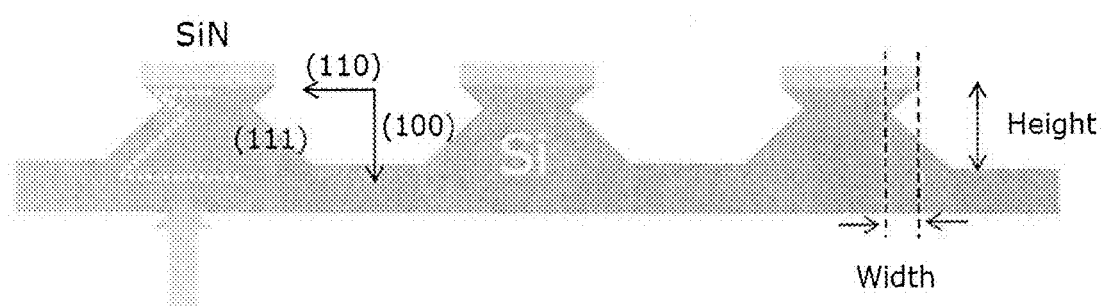

FIGS. 1A through 1C provide a prior art example of an anisotropic etching process using a conventional TMAH-based etchant chemical to form a sigma-shaped recess in a substrate. FIG. 1A provides a silicon substrate having a surface feature such as a gate wherein the crystal plane orientation of the surface of the substrate is (100). FIG. 1B shows a U shaped recess defined by points A, B, C, and D which is formed in the substrate by dry etching. Arrows C and D show the crystal plane orientations (111) and (110). FIG. 1C shows the results of a wet anisotropic etching process using a TMAH-based etchant chemical. However, in a wet anisotropic etching process, the etching rate of the (100) and (110) crystal orientations are faster than that of the (111) crystal plane orientation. This can cause the bottom of the U-shaped recess to be over-etched wherein the lower portions of the opposite sidewalls of the recess to intersect and form a cusp such as a V-shaped or curved peak instead of the desired flat bottom. FIG. 2 provides a cross-sectional view of the desired sigma-shaped ($\Sigma$) recess in the substrate that has a gate.

Therefore, there is a need in the art for an etching composition that is non-toxic and environmentally friendly for etching processes. There is a need in the art for etching compositions that provide a wider processing window. There is a need in the art for etching compositions that can selectively etch certain crystal planes or perform crystal orientation selective wet etching and provide a flat bottom. There is an additional need in the art to provide an etching composition that can provide an $\Sigma$-shaped recess for anisotropic etching. There is a further need in the art for an etching composition for use in the manufacture of semiconductors that provides an alternative to conventional etchant compounds, such as TMAH, and provides a more preferable etch pattern to that provided in the art.

SUMMARY

The composition and method of this invention fulfills one or more of the needs in the art by providing an etching composition that is useful for front end of line (FEOL), mid end of line (MEOL), and/or other processing steps. In one aspect, the present disclosure provides a composition useful for etching from a semiconductor substrate comprising in effective etching amounts: from about 25 to 80% by weight of water; from about 0 to about 60% by weight of a water-miscible organic solvent; from about 5 to about 30% by weight of a base comprising a quaternary ammonium compound; from about 0 to about 35% by weight of an amine compound wherein the amine compound is selected from the group consisting of a secondary amine, a tertiary amine, and mixtures thereof; from about 0 to about 5% by weight of a buffering agent; from about 0 to about 15% by weight of a corrosion inhibitor.

In another aspect of the invention is provided a composition useful for etching a semiconductor substrate comprising in effective etching amounts from about 25 to 86% by weight of water; from about 0 to about 60% by weight of a water-miscible organic solvent; from about 1 to about 30% by weight of a quarternary ammonium compound; from about 1 to about 50% by weight of an amine compound wherein the amine compound is selected from the group consisting of a secondary amine, a tertiary amine, and mixtures thereof; from about 0 to about 5% by weight of a buffering agent; and from about 0 to about 15% by weight of a corrosion inhibitor, wherein said etching composition provides a sigma-shaped etch profile (recess) in the substrate.

In another aspect of the invention, alone or with other aspects, the composition of the invention comprises from about 30 to 46% by weight of said water; from about 10 to about 50% by weight of said water-miscible organic solvent; from about 2 to about 6% by weight of said quarternary ammonium compound; and from about 10 to about 50% by weight of said amine compound wherein said etching composition provides a sigma-shaped etch profile with a (110)/(100) selectivity ratio, which for some embodiments may be, of about 0.1 or greater, or greater than 1, or of about 1 or greater, or others listed herein below.

In another aspect of the invention, alone or with other aspects, the composition of the invention comprises from about 32 to 42% by weight of said water; from about 20 to about 40% by weight of said water-miscible organic solvent; from about 3 to about 5% by weight of said quarternary ammonium compound; and from about 20 to about 40% by weight of said amine compound; wherein said etching composition provides a sigma-shaped etch profile (recess in the substrate) with a (110)/(100) selectivity ratio, which for some embodiments may be, of about 0.1 or greater, or about 1 or greater, or greater than 1, or others listed herein below.

In another aspect of the invention, alone or with other aspects, the composition of the invention comprises from about 34 to 40% by weight of said water; from about 25 to about 35% by weight of said water-miscible organic solvent; and from about 25 to about 35% by weight of said amine compound. In another aspect of the invention, alone or with other aspects, the composition may comprise from about 28 to 32% by weight of said water-miscible organic solvent and/or the composition may comprise from about 28 to 32% by weight of said amine.

In another aspect of the invention, alone or with other aspects, the composition of the invention comprises in effective etching amounts: from about 56 to 66% by weight of water; from about 1 to about 7% by weight of a quarternary ammonium compound; and from about 30 to about 40% by weight of an amine compound wherein the amine compound is selected from the group consisting of a secondary amine, a tertiary amine, and mixtures thereof; wherein said etching composition is substantially free of water-miscible organic solvent and provides a sigma-shaped etch profile (recess in the substrate) with a (110)/(100) selectivity ratio, which for some embodiments, may be of about 0.1 or greater, or 1 or greater, or greater than 1, or others listed herein below.

In another aspect of the invention, alone or with other aspects, the composition of the invention comprises from about 60 to 64% by weight of said water; from about 2 to about 6% by weight of said quarternary ammonium compound; and from about 32 to about 38% by weight of said amine compound.

In another aspect of the invention, alone or with other aspects, the composition of the invention comprises from about 45 to 62% by weight of said water; from about 2 to about 6% by weight of said quarternary ammonium compound; from about 5 to about 35% by weight of said amine compound; and from about 5 to about 30% by weight of a water-miscible organic solvent; wherein said etching composition provides a sigma-shaped profile in said substrate with a (110)/(100) selectivity ratio, which for some embodiments may be, of about 0.1 or greater, or of greater than 1, or of less than or equal to about 1, or others listed herein below.

In another aspect of the invention, alone or with other aspects, the composition of the invention comprises from about 49 to 60% by weight of said water; from about 3 to about 5% by weight of said quarternary ammonium compound; from about 10 to about 30% by weight of said amine compound; from about 5 to about 25% by weight of a water-miscible organic solvent; wherein said etching composition provides a sigma-shaped profile in said substrate with a (110)/(100) selectivity ratio, which for some embodiments may be, of between from about 0.1 or greater, or greater than 1, or about 0.3 to about 1, or others listed herein below.

In another aspect of the invention, alone or with other aspects, said quaternary ammonium compound in the composition of the invention comprises benzyltrimethylammonium hydroxide, triethylammonium hydroxide (TEAH) and ethyltrimethylammonium hydroxide (ETMAH), and mixtures thereof; and/or said amine of said composition is one or more alkanolamines.

In another aspect of the invention, alone or with other aspects, said amine or said said one or more alkanolamines are selected from the group consisting group consisting of monoethanol amine (MEA), triethanolamine (TEA), diethanolamine, N-methyl diethanolamine, diisopropanolamine, aminoethyl ethanol amine (AEE), N-methyl ethanol amine, and mixtures thereof.

In another aspect of the invention, alone or with other aspects said water-miscible organic solvent is selected from the group consisting of a polyol or diol.

In another aspect of the invention, alone or with other aspects wherein said quaternary ammonium compound is are selected from the group consisting of triethylammonium hydroxide, ethyltriammonium hydroxide or benzyltrimethylammonium hydroxide or mixtures thereof.

In another aspect of the invention, alone or with other aspects further comprising a polyfunctional acid alone and/or with its conjugate base and/or a salt of a polyfunctional acid. In another aspect of the invention, alone or with other aspects the pH of the composition of the invention is from about 11 to about 13.9 or from about 13 to about 13.9.

In another aspect, the present disclosure provides a method for etching a feature from a substrate comprising silicon, the method comprising the steps of: providing a composition comprising from about 25 to 80% by weight of water; from about 0 to about 60% by weight of a water-miscible organic solvent; from about 5 to about 30% by weight of a base comprising a quarternary ammonium compound; from about 0 to about 35% by weight of an amine compound wherein the amine compound is selected from the group consisting of a secondary amine, a tertiary amine, and mixtures thereof; from about 0 to about 5% by weight of a buffering agent; from about 0 to about 5% by weight of a corrosion inhibitor; and contacting the substrate with the composition.

In other aspects of the invention are provided methods for etching features of a semiconductor substrate comprising silicon comprising the steps of contacting the substrate to any of the compositions described herein to provide a sigma-shaped etch profile to said substrate.

FIGURES

FIGS. 1A through 1C provide cross-sectional views of an anisotropic etching process using conventional TMAH-based etchants that are known in the prior art.

FIG. 2 provides a cross-sectional view of the desired sigma-shaped recess.

Figure 3A:
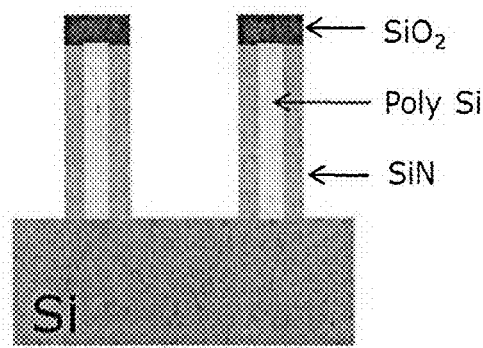
Figure 3B:
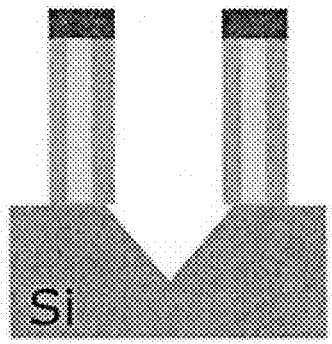
Figure 3C:
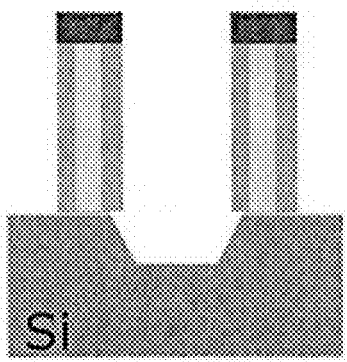

FIGS. 3A through 3C provide cross-sectional view of the anisotropic etching process on a substrate having a surface feature and before being treated (FIG. 3A) and after being treated with a conventional etchant composition (FIG. 3B) and the etching composition of this invention described herein (FIG. 3C), for Ex. 1 as described in Example 1.

Figure 4:
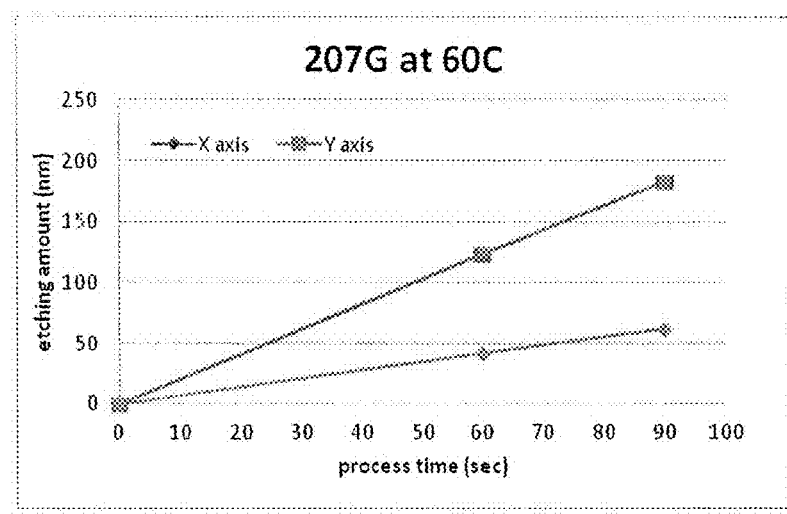

FIG. 4 provides the etching rate profile for the composition described in Example 7. Note, 207G is composition Ex. 10 described in Example 7.

Figure 5:
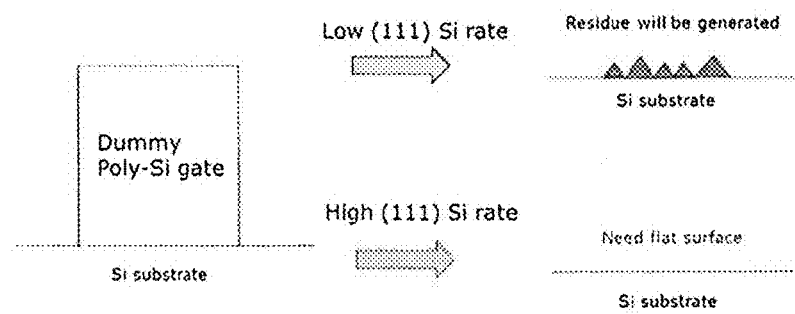

FIG. 5 provides an example of the effects of different etch rates of Si, or low (111) etch rate vs. high (111) rate of Si, on residues after treatment.

DETAILED DESCRIPTION

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

As used herein and in the claims, the terms "comprising," "comprises," "including," and "includes" are inclusive or open-ended and do not exclude additional unrecited elements, composition components, or method steps. Accordingly, these terms encompass the more restrictive terms "consisting essentially of" and "consisting of." Unless specified otherwise, all values provided herein include up to and including the endpoints given, and the values of the constituents or components of the compositions are expressed in weight percent of each ingredient in the composition.

The present invention provides a composition whose components are present in amounts that effectively etch from a substrate such as, for example, a semiconductor substrate. In applications concerning semiconductor substrates, such residues include, for example, photoresist residues, ash residues, and etch residues such as, for example, residues caused by reactive ion etching. Moreover, a semiconductor substrate also includes metal, silicon, silicate and/or inter-level dielectric material such as deposited silicon oxides, which will also come into contact with the etching composition. Typical metals include copper, copper alloy, cobalt, and other metals such as, for example, tungsten, titanium, tantalum, and aluminum.

The etching compositions of the present invention comprise, consist essentially of, or consist of: from about 25 to 80%, or 25 to 86% by weight of water; from about 0 to about 60% by weight of a water-miscible organic solvent; from about 5 to about 30%, or 1 to 30% by weight of a base comprising a quartenary ammonium compound; from about 0 to about 50%, or 1 to about 50% by weight of an amine compound wherein the amine compound is selected from the group consisting of a secondary amine, a tertiary amine, and mixtures thereof; from about 0 to about 5% by weight of a buffering agent; from about 0 to about 15% by weight of a corrosion inhibitor.

The role of each component will be explained below in greater detail.

All weight percents of the components detailed herein are based on the amount of the component as opposed to, for example, the weight of an aqueous solution of the component, unless otherwise indicated. The weight percentages described are the intended weight percentages when the compositions are used as an etchant. The compositions described are not intended to be diluted prior to use.

Water

The etching compositions of the present invention are aqueous-based and, thus, comprise water as the largest component in terms of weight percent of a composition. In the present invention, water functions in various ways such as, for example, to dissolve one or more solid components of the composition, as a carrier of the components, as an aid to facilitate the removal of inorganic salts and complexes, as a viscosity modifier of the composition, and as a diluent. Preferably, the water employed in the etching composition is de-ionized water (DIW) water.

It is believed that, for most applications, water will comprise, for example, from about 25 to about 80% or from about 25 to about 86% by wt. of the etching composition. Other preferred embodiments of the present invention could comprise from about 40 to about 80% or from about 40 to about 86% by wt. of water. Yet other preferred embodiments of the present invention could comprise from about 60 to about 75% by wt. of water. The amount of water in the composition may be any range having any of the lower and upper endpoints selected from the group consisting of 25, 26, 29, 30, 31, 32, 34, 36, 39, 40, 41, 42, 44, 45, 46, 49, 51, 54, 56, 59, 60, 61, 62, 64, 66, 69, 71, 74, 76, 79, 80, 84, 85, 86% by wt. of the etching composition. For examples, the amount of water may range from about 42 to about 46 wt % or from about 39 to about 51 wt % or from about 49 to about 59 wt % or any other combination of lower and upper endpoints. Such compositions having a large percentage of water are also referred to herein as "water-rich compositions." Still other preferred embodiments of the present invention could include water in an amount to achieve the desired weight percent of the other ingredients within the composition.

Quartenary Ammonium Compound (Base)

The etching composition of the present disclosure also comprises a base such as a quartenary ammonium compound.

In preferred embodiments, the quaternary ammonium compound is selected from the group consisting of benzyl-trimethylammonium hydroxide (sold under the brand name Triton B), triethylammonium hydroxide (TEAH) and ethyl-trimethylammonium hydroxide (ETMAH), and mixtures thereof.

It is believed that the amount of the quaternary ammonium compound in the composition will, for the most applications, comprise from about 1% to about 30% or from about 5% to about 30% by weight of the composition, specifically, about 10% to about 20% by weight of the composition when a 20 wt % concentration or a 100% concentration of the quaternary ammonium compound in water is used in the composition. Alternatively, the amount of the quaternary ammonium compound in the composition (on a 100 wt % concentration basis of the quaternary ammonium compound) may be within any range having lower and higher endpoints selected from the group consisting of 1, 2, 3, 3.5, 4, 5, 6, 7, 8, 9, 10, 12, 14, 16, 18, 19, 20, 21, 24, 26, 28, 30% by weight. For examples, the quaternary ammonium compound in the composition (on a 100 wt % concentration basis of the quaternary ammonium compound) may be from about 1 to about 30 wt %, or from about 2 to about 18 wt % or from about 10 to about 20 wt % or from about 16 to about 30 wt %, or from about 1 to about 7 wt %, or from about 2 to about 6 wt % or from about 3 to about 5 wt % or from about 3 to about 4 wt %.

Amine Compound

The etching composition of the present disclosure also comprises a secondary or tertiary organic amine. The secondary or tertiary organic amine functions primarily to provide the conjugate base component of the buffer but also, to the extent there is excess of what is needed for the buffer during the etching operation.

Examples of secondary or tertiary organic amine compounds for use as a buffer component in certain preferred embodiments of the present disclosure, include alkanolamines. Preferred alkanolamines include the lower alkanolamines which are secondary and/or tertiary having from 1 to 5 carbon atoms. Examples of such alkanolamines include diethanolamine, di- and triisopropanolamine, 2-(2-aminoethylamino)ethanol, 2-(2-aminoethoxy)ethanol, triethanolamine, N-ethyl ethanolamine, N,N-dimethylethanolamine, N,N-diethyl ethanolamine, N-methyl diethanolamine, N-ethyl diethanolamine, cyclohexylaminediethanol, and mixtures thereof.

In preferred embodiments, the amine compound is an alkanolamine selected from the group consisting of monoethanol amine (MEA), triethanolamine (TEA), diethanolamine, N-methyl diethanolamine, diisopropanolamine, aminoethyl ethanol amine (AEE), N-methyl ethanol amine, and mixtures thereof. In other preferred embodiments, alkanolamine is selected from the group consisting of monoethanol amine (MEA), aminoethyl ethanol amine (AEE) and mixtures thereof.

It is believed that the amount of the amine (alkanolamine) compound in the composition will, for the most applications, comprise from about 1 to about 50% or 1 to about 55% or from about 1% to about 30% by weight of the composition, or about 20% to about 30% by weight, or about 10 wt % to about 30 wt % of the composition. Alternatively, the amount of the amine (alkanolamine) compound (such as, monoethanol amine (MEA), aminoethyl ethanol amine (AEE) or others and mixtures thereof) in the composition may be within any range having lower and higher endpoints selected from the group consisting of 1, 2, 3, 3.5, 4, 5, 6, 7, 8, 9, 10, 12, 14, 16, 18, 19, 20, 21, 24, 26, 28, 30, 31, 32, 34, 35, 36, 38, 40, 41, 44, 46, 48, 50, 52, 55 wt %. For examples, the amount of amine (alkanolamine) in the composition may be from about 1 to about 21 wt %) by weight, or from about 18 to about 34 wt %, or from about 30 to about 50 wt %, or from about 10 to about 50 wt %, or from about 20 to about 40 wt %, or from about 30 to about 40 wt %, or from about 25 to about 35 wt % or from about 40 to about 55 wt %.

Polyfunctional Organic Acid (Buffer Component) (Optional)

The etching composition of the present disclosure may comprises one or more polyfunctional organic acids (and their salts, for example, ammonium salts), which function primarily as the conjugate acid portion of the buffer. As used herein, the term "polyfunctional organic acid" refers to an acid or a multi-acid that has more than one carboxylate group, including but not limited to, (i) dicarboxylate acids (such as malonic acid, malic acid, et al); dicarboxylic acids with aromatic moieties (such as phthalic acid et al), and combinations thereof; and (ii) tricarboxylic acids (such as citric acid et al), tricarboxylic acids with aromatic moieties (such as trimellitic acid, et al), and combinations thereof. The acids may be used in combination with their conjugate bases as a buffer. One example of a buffer comprises citric acid and triammonium citrate, as used in Ex. 10).

It is believed that the amount of polyfunctional organic acid in the compositions of the present disclosure will be from about 0 wt. % to 5 wt. %, or from about 0.1 wt. % to about 5 wt %, or from 0.25 wt. % to 3 wt. %, or from about 0.5 wt. % to about 2.0 wt. %, or from about 0.75 wt. % to about 1.5 wt. %. If a conjugate base, for example triammonium citrate, is also used, it may be present in the composition from about 0.1 wt. % to about 5 wt %, or from 0.25 wt. % to 3 wt. %, or from about 0.5 wt. % to about 2.0 wt. %, or from about 0.75 wt. % to about 1.5 wt. %.

Preferably, the polyfunctional organic acid and the rest of the composition are mixed in a ratio that will achieve a pH of from 10 to 14 or from 11 to 13.5, or any range having lower and upper endpoints selected from 10, 10.5, 11, 11.5, 12, 12.5, 13, 13.2, 13.4, 13.5, 13.6, 13.7, 13.8, 13.9 and 14. For some embodiments, the pH of the composition may be from about 12 to about 13.9, or from about 12.5 to about 13.8.

In some embodiments the compositions of this invention will be substantially free of any of the polyfunctional organic acids listed above or all polyfunctional organic acids and/or substantially free of inorganic acids and/or substantially free of organic acids. The composition may be free or substantially free of any of those acids, alone or in combination with other components described herein that the composition may be free or substantially free of in any combination. "Substantially free" as used herein, means that the composition will contain less than 0.5 wt %, or less than 0.25 wt %, or less than 1000 parts per million (ppm) or less than 100 ppm of a component.

Solvent (Optional)

The compositions according to the present disclosure optionally comprise at least one organic solvent. The organic solvent is preferably miscible with water. In various embodiments of the present invention, metal lines on the substrate typically dictate whether a water-miscible organic solvent is used. For example, when aluminum lines are present on a substrate, the combination of water and hydroxide ion will typically tend to etch the aluminum. In such embodiments, the use of water-miscible organic solvent can significantly reduce, if not eliminate, etching of aluminum.

Examples of water-miscible organic solvents include, but are not limited to, dimethylacetamide (DMAC), N-methyl pyrrolidinone (NMP), dimethylsulfoxide (DMSO), dimethylformamide, N-methylformamide, formamide, dimethyl-2-piperidone (DMPD), tetrahydrofurfuryl alcohol, glycerol, ethylene glycol, and other amides, alcohols or sulfoxides, or multifunctional compounds, such as hydroxyamides or amino alcohols. Further examples of the water-miscible organic solvents include diols and polyols such as ($C_2$-$C_{20}$) alkanediols and ($C_3$-$C_{20}$) alkanetriols, cyclic alcohols and substituted alcohols. Particular examples of these water-miscible organic solvents include propylene glycol, tetrahydrofurfuryl alcohol, diacetone alcohol and 1,4-cyclohexanedimethanol. In certain embodiments, the water-miscible organic solvent may be DMSO, NMP, and/or DMAC. The water-miscible organic solvents enumerated above may be used alone or in combination with two or more solvents.

In certain preferred embodiments of the present invention, the water-miscible organic solvent may comprise a glycol ether. Examples of glycol ethers include ethylene glycol monomethyl ether, ethylene glycol monoethyl ether, ethylene glycol monobutyl ether, ethylene glycol dimethyl ether, ethylene glycol diethyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl either, diethylene glycol monobenzyl ether, diethylene glycol dimethyl ether, diethylene glycol diethyl ether, triethylene glycol monomethyl ether, triethylene glycol dimethyl ether, polyethylene glycol monomethyl ether, diethylene glycol methyl ethyl ether, triethylene glycol ethylene glycol monomethyl ether acetate, ethylene glycol monethyl ether acetate, propylene glycol methyl ether acetate, propylene glycol monomethyl ether, propylene glycol dimethyl ether, propylene glycol monobutyl ether, propylene glycol, monopropyl ether, dipropylene glycol monomethyl ether, dipropylene glycol monopropyl ether, dipropylene glycol monoisopropyl ether, dipropylene monobutyl ether, diproplyene glycol diisopropyl ether, tripropylene glycol monomethyl ether, 1-methoxy-2-butanol, 2-methoxy-1-butanol, 2-methoxy-2-methylbutanol, 1,1-dimethoxyethane and 2-(2-butoxyethoxy) ethanol.

It is believed that, for most applications, the amount of water-miscible organic solvent will comprise from about 0% to about 60% by weight of the composition. Preferably, when employed, the water-miscible solvent comprises from about 20 to about 40% by weight of the composition. In alternative embodiments, the amount of water-miscible organic solvent can be in any range having lower and upper endpoints selected from 0, 4, 5, 6, 8, 10, 12, 16, 18, 20, 21, 24, 25, 26, 28, 31, 34, 35, 36, 39, 40, 41, 44, 46, 49, 50, 51, 54, 59, 60. For examples, the amount of organic solvent in the composition my be from about 6 to about 34 wt % or from about 18 to about 44 wt % or from about 5 to about 25 wt %, or about 28 to about 46 wt %, or from about 10 to about 50 wt %, or from about 25 to about 40 wt %, or from about 25 to about 35 wt %.

In some embodiments the compositions of this invention will be free of or substantially free of any or all of the above-listed water-miscible organic solvents or all water-miscible organic solvents added to the composition.

Additional Corrosion Inhibitors (Optional)

The compositions of the present disclosure optionally comprise at least one corrosion inhibitor. Corrosion inhibitors serve to react with the substrate surface being cleaned, which may be a metal, particularly copper, or a nonmetal, to passivate the surface and prevent excessive etching during cleaning. In particular and without being bound to any particular theory, it is believed that the corrosion inhibitor forms a coating of an insoluble chelate compound on the copper surface (or other metal surface), thus suppressing contact between the photoresist residue removal component and the metal thereby preventing corrosion.

Any corrosion inhibitor known in the art for similar applications, such as those disclosed in U.S. Pat. No. 5,417,877, which are incorporated herein by reference, may be used. The use of a corrosion-inhibitor is particularly preferred when the composition is used to clean a metallic substrate. Examples of corrosion-inhibitors include aromatic hydroxyl compounds, acetylenic alcohols, carboxyl group-containing organic compounds and anhydrides thereof, and triazole compounds.

Exemplary aromatic hydroxyl compounds include phenol, cresol, xylenol, pyrocatechol, resorcinol, hydroquinone, pyrogallol, 1.2.4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, amino resorcinol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, acetic acid, propionic acid, butyric acid, isobutyric acid, benzoic acid, glycolic acid, lactic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, catechol, t-butyl catechol, L-ascorbic acid, gallic acid, vanillin, salicylic acid, diethyl hydroxylamine, and poly(ethyleneimine).

Preferred copper corrosion inhibitors are selected from the group consisting of benzotriazole, amino-benzotriazole, L-ascorbic acid, gallic acid, vanillin, diethylhydroxylamine, and mixtures thereof.

In other embodiments, the corrosion inhibitor is a triazole and is at least one of benzotriazole, o-tolyltriazole, m-tolyltriazole, and p-tolyltriazole. In other embodiments, the triazole compound is selected from the group consisting of o-tolyltriazole, m-tolyltriazole, p-tolyltriazole, and mixtures thereof.

It is believed that for most applications, the corrosion-inhibitor will comprise from about 0 wt. % to about 15 wt. % of the composition; preferably it comprises from about 0.1 wt. % to about 10 wt. %, preferably, from about 0.5 wt. % to about 5 wt. %, and most preferably, from about 0.1 wt. % to about 1 wt. % or about 0.5 wt. % to about 5 wt. % 0.3 wt. % to about 1.5 wt. % of the composition.

When the corrosion inhibitor is a triazole compound selected from the group consisting of o-tolyltriazole, m-tolyltriazole, p-tolyltriazole, and mixtures thereof, it is preferred that the triazole is present in an amount of from 0.3 to about 1.5% by weight of the etching composition.

In some embodiments the compositions of this invention will be substantially free or free of (added) any or all of the above-listed corrosion inhibitors or all corrosion inhibitors, optionally in addition to other materials or compounds listed herein that the composition may be free or substantially free of. For example, the compositions may be substantially free of or free of added aromatic hydroxyl compounds and/or acetylenic alcohols an/or carboxyl group-containing organic compounds and/or anhydrides thereof, and/or triazole compounds.

In some embodiments, the compositions of the present disclosure are free of or substantially free of added metal ions and/or metal-containing compounds, optionally in addition to other materials and/or compounds listed herein.

In some embodiments, the compositions of the present disclosure are free of or substantially free of added halide-containing compounds, optionally in addition to other materials and/or compounds listed herein.

In other embodiments, the compositions of the present disclosure are, alone or additionally, free of or substantially free of added ammonium salts of sulfuric esters and/or added sulfur-containing compounds.

In other embodiments, the compositions of the present disclosure are, alone or additionally, free of or substantially free of added phosphorus-containing compounds.

In other embodiments, the compositions of the present disclosure are, alone or additionally, free of or substantially free of added hydroxylamines and/or hydroxylamine.

In other embodiments, the compositions of the present disclosure are, alone or additionally, free of or substantially free of added alkali hydroxides.

Other Optional Ingredients

The etching composition of the present invention may also include one or more of the following additives: surfactants, chelating agents, chemical modifiers, dyes, biocides, and other additives. The additive(s) may be added to the extent that they do not adversely affect the pH range of the composition.

Another optional ingredient that can be used in the etching composition is a metal chelating agent (other than EDTA); it can function to increase the capacity of the composition to retain metals in solution and to enhance the dissolution of metallic residues. Typical examples of chelating agents useful for this purpose are the following organic acids and their isomers and salts: butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra (methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as CyDTA and aminophosphonic acids such as EDTMP.

It is believed that, for most applications, the chelating agent will be present in the composition in an amount of from about 0 wt. % to about 10 wt. %, or 0.1 wt. % to about 10 wt. %, or from about 0.5 wt. % to about 5 wt. % of the composition.

Other commonly known components such as dyes, biocides etc. can be included in the etching composition in conventional amounts, for example, amounts up to a total of about 5 weight % of the composition.

In certain embodiments, the etching composition is free or substantially free of an added metal. In this or other embodiments, the etching composition is substantially free of an added particulate such as an abrasive. The term "substantially free" as earlier defined and used herein means having 0.5 weight percent (wt. %) or less or 0.25 wt. % or less or 1000 parts per million (ppm) or less or 100 ppm of a component. The term "added" means a component added to the composition. However, metal, added particulate, or both can be incorporated in the etching composition after contacting the substrate.

In other embodiments, the compositions of the present disclosure are, alone or additionally (with any of the other materials), free of or substantially free of any or all of the added surfactants and/or chelating agents and/or chemical modifiers and/or dyes and/or biocides, and/or other additives known or listed above, including EDTA. Additionally, the compositions of the present disclosure are, alone or additionally (with any of the other materials), free of or substantially free of any added fluorine-containing compounds and/or oxidizers. An example of fluorine-containing compounds includes quaternary ammonium fluorides and an example of an oxidizer is hydrogen peroxide, respectively. Many other examples are known in the art.

The etching composition of the present invention is typically prepared by mixing the components together in a vessel at room temperature until all solids have dissolved in the aqueous-based medium.

The etching composition of the present invention can be used to remove undesired residue from a substrate. It is believed that the composition can be used to particularly good advantage in etching a semiconductor substrate on which residue is deposited or formed during the process for manufacturing semiconductor devices; examples of such residue include resist compositions in the form of films (both positive and negative) and etching deposits formed during dry etching, as well as chemically degraded resist films. The use of the composition is particularly effective when the residue to be removed is a resist film and/or an etching deposit on a semiconductor substrate having a metal film-exposed surface. Examples of substrates that can be contacted with the compositions described herein include silicon substrates, silicon and germanium substrates, germanium substrates, aluminum titanium/tungsten; aluminum/silicon; aluminum/silicon/copper; silicon oxide; silicon nitride; silicon oxide; amorphous silicon; polysilicon; and gallium/arsenide. Silicon oxide can mean stoichiometric or non-stoichiometric SiO or $SiO_2$ which may also be doped with carbon, nitride, and/or other elements. Such substrates typically include residues comprising photoresists and/or post etch deposits.

Examples of resist compositions that can be effectively removed by use of the etching composition of the present invention include photoresists containing esters or ortho-naphthoquinones and novolak-type binders and chemically amplified resists containing blocked polyhydroxystyrene or copolymers of polyhydroxystyrene and photoacid generators. Examples of commercially available photoresist compositions include Clariant Corporation AZ 1518, AZ 4620, Shipley Company, Inc. photoresists, S1400, APEX-E™ positive DUV, UV5™ positive DUV, Megaposit™ SPR™ 220 Series; JSR Microelectronics photoresists KRF® Series, ARF® Series; and Tokyo Ohka Kogyo Co., Ltd. Photoresists TSCR Series and TDUR-P/N Series.

In addition to being effective when used to remove resist films and/or etching residues on a semiconductor wafer having an exposed surface of a metal film, the etching composition is especially effective when the metal film is made of copper or a copper alloy containing copper as the main component and also when a low-dielectric film is used as an interlayer insulating film. An example of a copper alloy containing copper as the main component is one containing 90% by weight or more copper, and other elements, for example, Sn, Ag, Mg, Ni, Co, Ti, Si, and Al. Since these metals have low resistances and improve the high-speed operation of elements, but are easily dissolved or corroded by chemicals, the "non-corrosive" properties of the composition of the present invention are significant.

The etching compositions described herein can be used to perform anisotropic or isotropic etching of one or more features on a silicon substrate, to form one or more features on a substrate (e.g., form a trench or via), or a combination thereof. The compositions described herein have etching selectivity over one or more crystal orientations as shown in FIG. 1, such as a (100), a (110), or a (111) orientation. In one embodiment, the etching selectivity of (100)/(110) ranges from 0.5 to 5. Alternatively, in another embodiment, the selectivity of (110)/(100) may range from about 0.1 to about 2.5, or from about 0.1 to about 2, or from about 0.2 to about 2.5, or about 0.3 to about 2.5, or from about 0.5 to about 2, or from about 0.7 to about 2, or from about 1 to about 2.5, from about 1.1 to about 2, or from about 1.2 to about 2, or from about 1.3 to about 2, or from about 1.5 to about 2, or from about 1.6 to about 2. The range of selectivity of (110)/(100) can have low and high endpoints selected from: 0.1, 0.2, 0.3, 0.5, 0.7, 1, 1.1 1.2, 1.3, 1.5, 1.6, 1.7, 1.8, 1.9, 2, 2.1, 2.2, 2.3, 2.4 and 2.5. In this or an alternative embodiment, the etching selectivity of (111)/(100) of at least about 0.5 or greater, or from about 0.5 to about 1, or from about 0.5 to about 0.8. The etching selectivity is defined as the ratio of etch rates (E/R) for the specific crystal orientations of interest. The etch rates are calculated as described below in the Examples using the weight change method, the SEM method, and/or by ellipsometry.

In another embodiment, the compositions described herein are useful for isotropic etching. FIG. 5 provides an example of an isotropic etching process to remove a dummy poly-silicon gate feature from the surface of a semiconductor substrate. FIG. 5 shows that compositions having a low (111) Si rate will generate pyramidal-shaped residues on the substrate surface whereas compositions having a relatively higher (111) Si rate will not generate pyramidal-shaped residues on the substrate surface. Generally, compositions that afford higher etch rates at the target selectivities above that is a selectivity of Si(111)/(100) higher than about 0.5 or from about 0.5 to 0.8 are preferred.

The etching composition of the present disclosure can be used to remove post-etch and ash, other organic and inorganic residues as well as polymeric residues from semiconductor substrates at relatively low temperatures with little corrosive effect. The etching composition should be applied to the surface for a period of time to sufficient to obtain the desired etching effect. The time will vary depending on numerous factors, including, for example, the nature of the residue the temperature of the etching composition and the particular etching composition used. In general, the etching composition can be used, for example, by contacting the substrate at a temperature of from about 25° C. to about 85° C. for a period of time ranging from about 1 minute to about 1 hour followed by rinsing the etching composition from the substrate and drying the substrate.

The contacting step can be carried out by any suitable means such as, for example, immersion, spray, or via a single wafer process; any method that utilizes a liquid for removal of photoresist, ash or etch deposits and/or contaminants can be used.

The rinsing step is carried out by any suitable means, for example, rinsing the substrate with de-ionized water by immersion or spray techniques. In preferred embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying or by centripetal force.

It will be appreciated by those skilled in the art that the etching composition of the present invention may be modified to achieve optimum etching without damaging the substrate so that high throughput etching can be maintained in the manufacturing process. For example, one skilled in the art would appreciate that, for example, modifications to the amounts of some or all of the components may be made depending upon the composition of the substrate being cleaned, the nature of the residue to be removed, and the particular process parameters used.

In one embodiment of the present invention, one or more sigma-shaped recesses can be formed on a substrate by a crystal orientation selective etching process. The sigma-shaped profile is similar to that shown in FIG. 2. The compositions described herein selectively etch in one or more of the (100), (110), and (111) crystal orientations to provide the desired sigma etching profile. In one particular embodiment, the sigma-shaped recess is an amorphous layer which comprises Ge, Si, $BF_2$, C, Xe, Sb or combinations thereof. The sigma-shaped recess preferably has a flat bottom. In one particular embodiment, this can be achieved or assisted by forming an amorphous layer at the bottom which acts as a stopping layer to the wet etching process.

Although the present invention has been principally described in connection with etching semiconductor substrates, the etching compositions of the invention can be employed to clean any substrate that includes organic and inorganic residues.

The following examples are provided for the purpose of further illustrating the present invention but are by no means intended to limit the same.

EXAMPLES

General Methods to Determine the Etch Rate:

Weight Change Method to determine the Si etch rate: In certain examples, each etchant composition tested was heated to the test temperature given in each specific Example. Blank (unpatterned) p-type Si wafer segments 3.5 cm×5 cm in size with exposed crystal orientation of interest, were cleaved from a whole wafer. The two-sided Si segments were pre-treated with buffered oxide etch (BOE) at an ambient temperature of approximately 22° C. for 1 minute to remove native surface oxide, rinsed in deionized water (DIW) for 3 minutes and dried with a nitrogen ($N_2$) gun. Si segments were then weighed on a balance with 5 decimal places for an accurate recording of the weight. The Si segments were then immersed into the etchant for a specific amount of time, removed and rinsed in deionized water (DIW) for 3 minutes, dried with $N_2$, then weighed. The initial and final thicknesses in nanometers were determined from the difference in weight (Untreated−Treated) and assuming a Si density of 2.33 gm/cm$^3$ and from the area of the 3.5 cm×5.0 cm segment. Etch rates in nm/min were calculated from the thickness change (Untreated−Treated) during the etch experiment, divided by the time stated in each specific Example. Etch rates for a single side of the Si wafer is obtained by dividing the above etch rate by 1.8, which accounts for the exposed edges. This method was repeated to determine the Si etch rates for the compositions reported in the Examples described herein.

SEM Method to determine the Si etch rate: In certain examples, untreated (unpatterned) p-type Si wafer segments with exposed crystal orientation of interest were cleaved, mounted into an SEM instrument, and the cross-sectional thickness was measured. An average of three (3) such thickness measurements is obtained for the untreated Si wafer segment. Each etchant composition tested was heated to the test temperature given in each specific Example. Separately, blank (unpatterned) p-type Si wafer segments 3.5 cm×5 cm in size were cleaved from a whole wafer with the exposed crystal orientation. The two-sided Si segments were pre-treated with buffered oxide etch (BOE) at an ambient temperature of approximately 22° C. for 1 minute to remove native surface oxide, rinsed in deionized water (DIW) for 3 minutes and dried with a nitrogen ($N_2$) gun. The Si segments were then immersed into the etchant and treated for a specific amount of time, removed and rinsed in deionized water (DIW) for 3 minutes, dried with $N_2$, then weighed. The final thickness of the Treated Si wafer segment was determined by placing a piece of the Treated Si wafer segment into the SEM and the cross-section thickness in nanometers was measured. Etch rates in nanometers/minute (nm/min) were calculated from the thickness change (Untreated−Treated) during the etch experiment, divided by the time stated in each specific Example. Etch rates for a single side of the Si wafer is obtained by dividing the above etch rate by 1.8, which accounts for the exposed edges. This method was repeated to determine the Si etch rates for the compositions reported in the tables below.

Ellipsometry Method to determine the Si etch rate: Film thickness measurements for poly-silicon substrates were performed using an ellipsometer. Ellipsometry measurements were carried out using a FilmTek SCI ellipsometer. Etch rates for these substrates were determined by calculating the film thickness changes (Untreated−Treated) using the ellipsometer method, and dividing the thickness change by the immersion time stated in each specific Example. The SEM Method was used to validate the film thickness changes of substrates for which the ellipsometer method described was used.

Example 1: Comparison of Etching Compositions Described Herein Vs. Conventional Etching Compositions The compositions, Ex. 1 and Comp. Ex. 1, shown in Table 1 were made by mixing and blending the components set forth below and stirred at room temperature. Prior to adding the catechol to the Ex. 1 formulation, the catechol was exposed to ambient air for a number of hours at room temperature to minimize color change during processing at temperatures above ambient and extended bath life (e.g., 4-8 hours).

TABLE I

| Components | Ex. 1 | Comp. Ex. 1 |
| --- | --- | --- |
| Triton B (40%) | 10 | 10 |
| Deionized Water (DIW) | 77 | 79 |
| Monoethanol Amine (MEA) | 10 | 10 |
| Triammonium citrate (TAC) - 100% | 1 | 1 |
| Catechol | 2 | 0 |
| pH | 11.35 | 13.16 |

Silicon wafers having a surface feature or silicon nitride gates were treated in a bath containing the etching compositions at a temperature of 65° C. for 1 minute with a conventional etching chemical of 5 wt % quarternary ammonium hydroxide ($NH_4OH$) aqueous solution and the etching composition described herein or Ex. 1. Cross-sections of the treated wafers were examined under scanning electron microscopy (SEM) to see the resultant etchant profile after treatment. The conventional etching chemical did not produce a sigma-shaped etching profile because of its lower (110) etch rate. By contrast, Ex. 1 produced the sigma etching profile because of its relatively higher (110) etch rate. FIGS. 3A through 3C provide an illustration of the substrate before treatment (FIG. 3A) and after treatment with the $NH_4OH$ conventional etching composition (FIG. 3B) and Ex. 1 (FIG. 3C).

Example 2: Comparison of Claimed Formulation Vs. Conventional Formulation

Comp. Ex. 1 was prepared using the ingredients listed above in Table 1 and is similar to Ex. 1 except that Comp. Ex. 1 did not include ingredient catechol. Silicon wafers having a surface feature or silicon nitride gates were treated in a bath containing etching chemicals Ex. 1 and Comp. Ex. 1 at a temperature of 60° C. for about 1. Cross-sections of the treated wafers were examined under scanning electron microscopy (SEM) to see the resultant etchant profile after treatment. The Comp. Ex. 1 formulation did not produce a sigma-shaped etching but rather a "V" shaped etch. By contrast, Ex. 1 produced the desired sigma etching profile.

Example 3: Exemplary Compositions Containing Propylene Glycol Instead of Catechol Compositions 2 and 3 were prepared as described in Example 1 using the ingredients and wt. % as provided in Table 2 below with the exception that the catechol was replaced with 5 wt. % or 10 wt. % propylene glycol, respectively. Silicon wafers having a surface feature or silicon nitride gates were treated in a bath containing etching chemicals Ex. 2 and Ex. 3 at a temperature of 65° C. for about 1 minute. Cross-sections of the treated wafers were examined under scanning electron microscopy (SEM) to see the resultant etchant profile after treatment. Both Ex. 2 and 3 provided a sigma-shaped etching pattern. However, Ex. 3, which had the higher wt. % of PG, had a higher (desired) (110) etch rate.

TABLE 2

| Components | Ex. 2 | Ex. 3 |
| --- | --- | --- |
| Triton B (40%) | 10 | 10 |
| Deionized Water (DIW) | 54 | 49 |
| Monoethanol Amine (MEA) | 30 | 30 |
| Triammonium citrate (TAC) - 100% | 1 | 1 |
| Propylene Glycol | 5 | 10 |
| pH | 13.56 | 13.6 |

Example 4: Exemplary Compositions Containing Different Quarternary Ammonium Salt Compounds Compositions 4 and 5 were prepared as described in Example 1 using the ingredients and wt. % as provided in Table 3 below with the exception that the Ex. 4 had the quarternary ammonium salt compound Triton B and Ex. 5 had the tetraethyl ammonium hydroxide. Silicon wafers having a surface feature or silicon nitride gates were treated in a bath containing etching chemicals Ex. 4 and Ex. 5 at a temperature of 65° C. for about 90 seconds. Cross-sections of the treated wafers were examined under scanning electron microscopy (SEM) to see the resultant etchant profile after treatment. Ex. 4 provided a sigma-shaped etching pattern. However, Ex. 5 containing TEAH was too aggressive on Si etching and removed the surface feature on the substrate entirely.

TABLE 3

| Components | Ex. 4 | Ex. 5 |
|---|---|---|
| Triton B (40%) | 10 | 0 |
| TEAH (35%) | 0 | 10 |
| Deionized Water (DIW) | 50 | 50 |
| Aminoethyl ethanol amine (AEE) | 20 | 20 |
| Glycerol | 20 | 20 |
| pH | 13.2 | 13.28 |

Example 5: Exemplary Compositions Containing Different Amines

Compositions 6 and 7 were prepared as described in Example 1 using the ingredients and wt. % as provided in Table 4 below with the exception that the Ex. 6 had the amine MEA and Ex. 7 had the amine AEE. Silicon wafers having a surface feature or silicon nitride gates were treated in a bath containing etching chemicals Ex. 6 and Ex. 7 at a temperature of 65° C. for about 45 seconds. Cross-sections of the treated wafers were examined under scanning electron microscopy (SEM) to see the resultant etchant profile after treatment. Both Ex. 6 and 7 provided the sigma-shaped etching pattern. However, Ex. 7 containing AEE has found to have a higher etch rate on horizontal (110) and vertical (100) than Ex. 6 containing MEA. The etch rate selectivity or horizontal vs. vertical for Ex. 6 and Ex. 7 was 1:3 and 1:1, respectively as measured via SEM. The Ex. 7 composition had a desirable etch rate selectivity or X/Y of 80.9 nm/80.9 nm=1:1.

TABLE 4

| Components | Ex. 6 | Ex. 7 |
|---|---|---|
| Triton B (40%) | 10 | 10 |
| Deionized Water (DIW) | 50 | 50 |
| MEA | 30 | 0 |
| Aminoethyl ethanol amine (AEE) | 0 | 30 |
| Propylene Glycol | 10 | 10 |
| pH | 13.81 | 13.86 |

Example 6: Exemplary Compositions with and without Triammonium Citrate

Compositions 8 and 9 were prepared as described in Example 1 using the ingredients and wt. % as provided in Table 5. Silicon wafers having a surface feature or silicon nitride gates were treated in a bath containing etching chemicals Ex. 8 and Ex. 9 at a temperature of 65° C. for about 45 seconds. Cross-sections of the treated wafers were examined under scanning electron microscopy (SEM) to see the resultant etchant profile after treatment. Both Ex. 8 and 9 provided sigma-shaped etching pattern. However, Ex. 8 containing triammonium citrate has found to have a slower etch rate on both the horizontal (110) and vertical direction (100).

TABLE 5

| Components | Ex. 8 | Ex. 9 |
|---|---|---|
| Triton B (40%) | 10 | 10 |
| Deionized Water (DIW) | 49 | 50 |
| MEA | 30 | 30 |
| Triammonium Citrate | 1 | 0 |
| Propylene Glycol | 10 | 10 |
| pH | 13.6 | 13.81 |

Example 7: Etch Rate and Bath Life Performance of Ex. 10

Exemplary composition Ex. 10 provided in Table 6 was made by mixing and blending the components set forth below and stirred at room temperature.

TABLE 6

| Components | Ex. 10 |
|---|---|
| TEAH (35%) | 10 |
| Deionized Water (DIW) | 42.6 |
| MEA | 20 |
| PG | 25 |
| TAC | 1 |
| Citric Acid | 1.4 |
| pH | 11.5 |

Silicon wafers having a surface feature, or silicon nitride gates, were treated in a bath containing exemplary composition Ex. 10 at a temperature of 60° C. at 90 seconds. A cross-section of the treated wafer was examined under scanning electron microscopy (SEM) to see the resultant etchant profile after treatment which confirmed the sigma-shaped etchant profile at a X and Y selectivity of 62 nanometers (nm) and 183 nm, respectively. The etch rate selectivity or horizontal vs. vertical for Ex. 10 was 1:3. FIG. 4 provides the etching amount for the X and Y access and for exposures at process times ranging from 10 to 90 seconds. (X is horizontal; Y is vertical.)

Silicon wafers having surface features were all evaluated by soaking the substrate at 60° C. for 0 hour, 60° C. for 6 hours, and 60° C. for 11 hours. Cross-sections of the treated wafers were examined under scanning electron microscopy (SEM) to see the resultant etchant profile after treatment after each soak time. At the later condition, or 60° for 11 hours, there was a higher X and Y rate than at the earlier conditions. However, the sigma shaped etch profile was maintained at 60° C. for 6 hours. The bath life of Ex. 10 was found to be higher than 6 hours at 60° C. Further, no color change was observed for the formulation at 60° for 11 hours.

Example 8: Exemplary Compositions

Compositions 11 and 12 were prepared as described in Example 1 using the ingredients and wt. % as provided in Table 7 below. Silicon wafers having a surface feature or silicon nitride gates were treated in a bath containing etching chemicals Ex. 11 and Ex. 12 at a temperature of 60° C. for about 45 seconds. Cross-sections of the treated wafers were examined under scanning electron microscopy (SEM) to see the resultant etchant profile after treatment. Both Ex. 11 and 12 provided the sigma-shaped etching pattern. The etch rate selectivity or horizontal vs. vertical for Ex. 11 and Ex. 12 was 1.75:1 (e.g., 105 nm/60 nm) and 2:1 (e.g., 105 nm/52 nm), respectively as measured via SEM. In some embodiments having an equal or higher horizontal vs. vertical E/R is desirable, for example horizontal vs. vertical of 1:1 to 3:1, or from 1:1 to 2.5:1, or from 1:1 to 2:1, or from 1.3 to 2.5:1 may be desirable. In alternative embodiments, it will be more desirable to have a horizontal vs. vertical E/R that is 1:1 or less, such as between from about 0.3:1 to about 1:1 from about 0.5:1 to about 1:1 or from about 0.8:1 to about 1:1.

TABLE 7

| Components | Ex. 11 | Ex. 12 |
| --- | --- | --- |
| Triton B (40%) | 10 | 10 |
| Deionized Water (DIW) | 40 | 30 |
| Aminoethyl ethanol amine (AEE) | 30 | 30 |
| Propylene Glycol | 20 | 30 |
| pH | | |

Bare silicon wafers were treated in separate baths containing the etching composition Ex. 12 and a conventional etching chemical having tetraethyl ammonium hydroxide (TEAH) at a temperature of 60° C. for 5 minutes. Cross-sectional and top down views of the treated wafers were examined under scanning electron microscopy (SEM) to see the resultant etchant profile after treatment. After 5 minutes of treatment, the conventional etching chemical generated pyramid-shaped etching profile as evidenced in both SEM views. By contrast, Ex. 12 produced no pyramid shape profiles. These results are shown in FIG. 5.

The wafer that was first treated with the conventional etching chemical containing TEAH was then placed in the etching bath containing the Ex. 12 composition at a temperature of 60° C. for 5 minutes. The treated wafer was then examined using SEM. After treatment with the Ex. 12 composition, the pyramid-shaped etching residues were totally removed. This demonstrates that the Ex. 12 composition may be useful for isotropic etching.

Example 9: Exemplary Compositions Containing Different Amines

Exemplary composition 12 were prepared as described in Example 1 using the components and wt. % as provided in Table 7 above. Exemplary composition 13 was prepared as described in Example 1 and was similar to exemplary composition 12 except it had the amine MEA rather than the amine AEE (see Table 8 below). Bare Silicon wafers (100) and (110) were treated in a bath containing etching chemicals Ex. 12 and Ex. 13 at a temperature of 60° C. for 30 minutes. Ex. 13 containing MEA was found to have a higher etch rate (E/R) than Ex. 12 containing AEE. The (E/R) selectivity on horizontal (110) and vertical (100) for Ex. 12 and Ex. 13 was 2190 (Å/min)/1570 (Å/min) and 3249 (Å/min)/2084 (Å/min), respectively as measured by weight loss.

TABLE 8

| Components | Ex. 13 |
| --- | --- |
| Triton B (40%) | 10 |
| Deionized Water (DIW) | 30 |
| MEA | 30 |
| Aminoethyl ethanol amine (AEE) | 0 |
| Propylene Glycol | 30 |

Example 10: Exemplary Compositions for the Ratio Adjustment Between MEA and PG

Compositions 14 and 15 were prepared as described in Example 1 using the ingredients and wt. % as provided in Table 9 below with the exception that the Ex. 14 had 10 wt. % of the amine MEA and 50 wt. % of the solvent propylene glycol and Ex. 15 had 50 wt. of the amine MEA and 10 wt. % of the solvent propylene glycol. Bare Silicon wafers (100) and (110) were treated in a bath containing etching chemicals Ex. 14 and Ex. 15 at a temperature of 60° C. for 30 minutes. These two exemplary compositions provided similar results in terms of etch rate selectivity. The etch rate selectivity, or horizontal vs. vertical for Ex. 14 and Ex. 15, was 3082 (Å/min)/1837 (Å/min) and 3253 (Å/min)/1867 (Å/min), respectively as measured by weight loss.

TABLE 9

| Components | Ex. 14 | Ex. 15 |
| --- | --- | --- |
| TEAH (35%) | 10 | 10 |
| Deionized Water (DIW) | 30 | 30 |
| MEA | 10 | 50 |
| Propylene Glycol | 50 | 10 |

Example 11: Exemplary Compositions for the Adjustment of Amine

Exemplary compositions 16 and 17 were prepared as described in Example 1 using the ingredients and wt. % as provided in Table 10 below with the exception that the Ex. 16 had 40 wt. % of the amine MEA and Ex. 17 had 30 wt. % of the amine MEA. Bare Silicon wafers (100), (110) and (111) were treated in a bath containing exemplary etching compositions Ex. 16 and Ex. 17 at a temperature of 50° C. for 30 minutes. Ex. 16 has a higher etch rate selectivity. The etch rate selectivity: (110)/(100) for Ex. 16 was 1.75 (2913 Å/min/1665 Å/min) and for Ex. 17 was 1.30 (3117 Å/min/2405 Å/min) and (111)/(100) for Ex. 16 was 0.54 (896 Å/min/1665 Å/min) and for Ex. 17 was 0.48 (1157 Å/min/2405 Å/min), respectively as measured by weight loss.

In addition, the exemplary compositions were exposed to the following substrates: on amorphous silicon (a-Si), polycrystalline silicon (c-poly) and PEALD oxide. a-Si and c-poly (high temp annealed poly Si are used for dummy gate which will be removed in gate last process scheme. PEALD is plasma enhanced atomic layer deposited silicon oxide which is used for gate oxide and should not be damaged. Ex. 17 has a higher etch rate on all of the foregoing substrates. The etch rate (E/R) on a-Si, c-poly and PEALD oxide for Ex. 16 was 320 Å/min, 1200 Å/min and 0.1057 Å/min, respectively and for Ex. 17 was 403 Å/min, 1316 Å/min and 0.087 Å/min, respectively as measured by ellipsometer. In this Example, the PEALD oxide acts as a barrier stop layer. Therefore, the lower E/R on PEALD oxide is necessary and therefore, the Ex.17 has a better performance.

TABLE 10

| Components | Ex. 16 | Ex. 17 |
| --- | --- | --- |
| TEAH (35%) | 10 | 10 |
| Deionized Water (DIW) | 50 | 60 |
| MEA | 40 | 30 |

The pH of Ex. 16 is 14.27 and no pH measurement was obtained for Ex. 17.

Example 12: Exemplary Compositions Containing Different Quartenary Ammonium Compound Exemplary compositions 17 and 18 were prepared as described in Example 1 using the ingredients and wt. % as provided in Tables 10 and 11 with the exception that the Ex. 17 had 10 wt. % of TEAH and Ex. 18 had the 20 wt. % of ETMAH. Bare Silicon wafers (100), (110) and (111) were treated in a bath containing etching chemicals Ex. 17 and Ex.18 at a temperature of 50° C. for 30 minutes. Ex. 18 has a higher etch rate selectivity on (110)/(100) which was 1.56 (2602 Å/min/1665 Å/min) and Ex. 17 has a higher etch rate selectivity on (111)/(100) was 0.45 (1149 Å/min/2573 Å/min) as measured by weight loss.

In addition, Ex. 18 has a higher E/R on amorphous silicon (a-Si), and lower E/R on PEALD oxide. The E/R on a-Si, and PEALD oxide for Ex. 18 was 514 Å/min and 0.08 Å/min, respectively as measured by ellipsometer. The E/R on a-Si, c-poly and PEALD ox for Ex. 17 was described above in Example 11.

TABLE 11

| Components | Ex. 18 |
|---|---|
| ETMAH (20%) | 20 |
| Deionized Water (DIW) | 50 |
| MEA | 30 |

Example 13: Exemplary Compositions for the Adjustment of ETMAH

Compositions 19 and 20 were prepared as described in Example 1 using the components and wt. % as provided in Table 12 below with the exception that the Ex. 19 had the ETMAH 25% and Ex. 20 had the ETMAH 20%. Bare Silicon wafers (100), (110) and (111) were treated in a bath containing etching chemicals Ex. 19 and Ex. 20 at a temperature of 50° C. for 30 minutes. Ex. 20 has a higher etch rate selectivity on (110)/(100) and (111)/(100) which was 1.67 (3970 Å/min/2375 Å/min) and 0.61 (1454 Å/min/2375 Å/min), respectively as measured by weight loss.

In addition, Ex. 20 has a higher E/R on amorphous silicon (a-Si), and lower E/R on PEALD ox. The E/R on a-Si, c-poly and PEALD ox for Ex. 20 was 559 Å/min, 1352 Å/min and 0.088 Å/min, respectively as measured by ellipsometer. The E/R on a-Si, c-poly and PEALD ox for Ex. 19 was 506 Å/min, 1501 Å/min and 0.08 Å/min, respectively as measured by ellipsometer.

TABLE 12

| Components | Ex. 19 | Ex. 20 |
|---|---|---|
| ETMAH (20%) | 25 | 30 |
| Deionized Water (DIW) | 45 | 40 |
| MEA | 30 | 30 |

While the principles of the invention have been described above in connection with preferred embodiments, it is to be clearly understood that this description is made only by way of example and not as a limitation of the scope of the invention.

The invention claimed is:

1. A composition useful for etching a semiconductor substrate comprising in effective etching amounts:
   from about 25 to 66% by weight of water;
   from about 0 to about 60% by weight of a water-miscible organic solvent selected from propylene glycol, tetrahydrofurfuryl alcohol, diacetone alcohol and 1,4-cyclohexanedimethanol;
   from about 1 to about 30% by weight of a quaternary ammonium compound selected from benzyltrimethylammonium hydroxide and ethyltrimethylammonium hydroxide (ETMAH);
   from about 1 to about 50% by weight of an amine compound wherein the amine compound is selected from monoethanol amine (MEA), triethanolamine (TEA), diethanolamine, N-methyl diethanolamine, diisopropanolamine, aminoethyl ethanol amine (AEE), N-methyl ethanol amine, and mixtures thereof;
   from about 0 to about 5% by weight of a buffering agent; and
   from about 0 to about 15% by weight of a corrosion inhibitor;
   wherein the composition is free of alkali hydroxides;
   wherein said etching composition provides a sigma-shaped profile.

2. The composition of claim 1 comprising:
   from about 30 to 46% by weight of said water;
   from about 10 to about 50% by weight of said water-miscible organic solvent;
   from about 2 to about 6% by weight of said quaternary ammonium compound; and
   from about 10 to about 50% by weight of said amine compound wherein said etching composition provides a sigma-shaped profile with a (110)/(100) selectivity ratio of about 0.3 or more.

3. The composition of claim 1 useful for etching a semiconductor substrate comprising in effective etching amounts:
   from about 32 to 42% by weight of said water;
   from about 20 to about 40% by weight of said water-miscible organic solvent;
   from about 3 to about 5% by weight of said quaternary ammonium compound; and
   from about 20 to about 40% by weight of said amine compound;
   wherein said etching composition provides a sigma-shaped profile with a (110)/(100) selectivity ratio of greater than 0.3.

4. The composition of claim 3 useful for etching a semiconductor substrate comprising in effective etching amounts:
   from about 34 to 40% by weight of said water;
   from about 25 to about 35% by weight of said water-miscible organic solvent; and
   from about 25 to about 35% by weight of said amine compound.

5. The composition of claim 1 useful for etching a semiconductor substrate comprising in effective etching amounts:
   from about 56 to 66% by weight of water;
   from about 1 to about 7% by weight of a quaternary ammonium compound; and
   from about 30 to about 40% by weight of the amine compound;
   wherein said etching composition is substantially free of water-miscible organic solvent and provides a sigma-shaped profile with a (110)/(100) selectivity ratio of about 0.3 or more.

6. The composition of claim 5 useful for etching a semiconductor substrate comprising in effective etching amounts:
from about 60 to 64% by weight of said water;
from about 2 to about 6% by weight of said quaternary ammonium compound; and
from about 32 to about 38% by weight of said amine compound.

7. The composition of claim 1 useful for etching a semiconductor substrate comprising in effective etching amounts:
from about 45 to 62% by weight of said water;
from about 2 to about 6% by weight of said quaternary ammonium compound;
from about 5 to about 35% by weight of said amine compound; and
from about 5 to about 30% by weight of a water-miscible organic solvent;
wherein said etching composition provides a sigma-shaped profile in said substrate with a (110)/(100) selectivity ratio of about 0.3 or more.

8. The composition of claim 7 useful for etching a semiconductor substrate comprising in effective etching amounts:
from about 49 to 60% by weight of said water;
from about 3 to about 5% by weight of said quaternary ammonium compound;
from about 10 to about 30% by weight of said amine compound; and
from about 5 to about 25% by weight of a water-miscible organic solvent;
wherein said etching composition provides a sigma-shaped profile in said substrate with a (110)/(100) selectivity ratio of about 0.3 or more.

9. The composition of claim 1 wherein said quaternary ammonium compound comprises benzyltrimethylammonium hydroxide.

10. The composition of claim 9 said amine comprises aminoethyl ethanol amine (AEE).

11. A method for etching a semiconductor substrate comprising:
contacting the semiconductor substrate with a composition comprising in effective etching amounts:
from about 25 to 66% by weight of water;
from about 0 to about 60% by weight of a water-miscible organic solvent selected from propylene glycol, tetrahydrofurfuryl alcohol, diacetone alcohol and 1,4-cyclohexanedimethanol;
from about 1 to about 30% by weight of a quaternary ammonium compound selected from benzyltrimethylammonium hydroxide and ethyltrimethylammonium hydroxide (ETMAH);
from about 1 to about 50% by weight of an amine compound wherein the amine compound is selected from monoethanol amine (MEA), triethanolamine (TEA), diethanolamine, N-methyl diethanolamine, diisopropanolamine, aminoethyl ethanol amine (AEE), N-methyl ethanol amine, and mixtures thereof;
from about 0 to about 5% by weight of a buffering agent; and
from about 0 to about 15% by weight of a corrosion inhibitor;
wherein the composition is free of alkali hydroxides; and
wherein the contacting step is conducted for a certain time and temperature effective to selectively etch a portion of the substrate and to provide a sigma shaped etch profile.

12. The method of claim 11 comprising contacting the semiconductor substrate with said composition comprising:
from about 30 to 46% by weight of said water;
from about 10 to about 50% by weight of said water-miscible organic solvent;
from about 2 to about 6% by weight of said quaternary ammonium compound; and
from about 10 to about 50% by weight of said amine compound wherein said etching composition provides a sigma-shaped profile with a (110)/(100) selectivity ratio of about 0.3 or more.

13. The method of claim 11 comprising contacting the semiconductor substrate with said composition comprising:
from about 32 to 42% by weight of said water;
from about 20 to about 40% by weight of said water-miscible organic solvent;
from about 3 to about 5% by weight of said quaternary ammonium compound; and
from about 20 to about 40% by weight of said amine compound;
wherein said etching composition provides a sigma-shaped profile with a (110)/(100) selectivity ratio of 0.3 or more.

14. The method of claim 13 comprising contacting the semiconductor substrate with said composition comprising:
from about 34 to 40% by weight of said water;
from about 25 to about 35% by weight of said water-miscible organic solvent; from about 3 to about 5% by weight of said quaternary ammonium compound; and
from about 25 to about 35% by weight of said amine compound.

15. The method of claim 11 comprising contacting the semiconductor substrate with said composition comprising:
from about 56 to 66% by weight of water;
from about 1 to about 7% by weight of a quaternary ammonium compound; and
from about 30 to about 40% by weight of said amine compound;
wherein said etching composition is substantially free of water-miscible organic solvent and provides a sigma-shaped profile with a (110)/(100) selectivity ratio of about 0.3 or more.

16. The method of claim 15 comprising contacting the semiconductor substrate with said composition comprising:
from about 60 to 64% by weight of said water;
from about 2 to about 6% by weight of said quaternary ammonium compound; and
from about 32 to about 38% by weight of said amine compound.

17. The method of claim 11 comprising contacting the semiconductor substrate with said composition comprising:
from about 45 to 62% by weight of said water;
from about 2 to about 6% by weight of said quaternary ammonium compound;
from about 5 to about 35% by weight of said amine compound; and
from about 5 to about 30% by weight of a water-miscible organic solvent;
wherein said etching composition provides a sigma-shaped profile in said substrate with a (110)/(100) selectivity ratio of about 0.3 or more.

18. The method of claim 17 comprising contacting the semiconductor substrate with said composition comprising:
from about 49 to 60% by weight of said water;
from about 3 to about 5% by weight of said quaternary ammonium compound;
from about 10 to about 30% by weight of said amine compound; and from about 5 to about 25% by weight of a water-miscible organic solvent;
wherein said etching composition provides a sigma-shaped profile in said substrate with a (110)/(100) selectivity ratio of between from about 0.3 or more.

19. The method of claim 15 comprising contacting the semiconductor substrate with said composition wherein said quaternary ammonium compound comprises benzyltrimethylammonium hydroxide.

20. The method of claim 19 comprising contacting the semiconductor substrate with said composition comprising said one or more alkanolamines comprises aminoethyl ethanol amine (AEE).

21. The composition of claim 1 wherein said amine comprises aminoethyl ethanol amine (AEE).

22. The method of claim 11, wherein said amine comprises aminoethyl ethanol amine (AEE).

* * * * *